(12) United States Patent
Cobianu et al.

(10) Patent No.: US 7,927,906 B2
(45) Date of Patent: Apr. 19, 2011

(54) METHOD FOR MEMS THRESHOLD SENSOR PACKAGING

(75) Inventors: Cornel P. Cobianu, Bucharest (RO);
Viorel-Georgel Dumitru, Prahova (RO);
Ion Georgescu, Bucharest (RO)

(73) Assignee: Honeywell International Inc.,
Morristown, NJ (US)

( * ) Notice: Subject to any disclaimer, the term of this patent is extended or adjusted under 35 U.S.C. 154(b) by 88 days.

(21) Appl. No.: 12/025,517

(22) Filed: Feb. 4, 2008

(65) Prior Publication Data
US 2009/0194828 A1 Aug. 6, 2009

(51) Int. Cl.
*H01L 21/00* (2006.01)
(52) U.S. Cl. .............. 438/52; 257/564; 257/E21.613
(58) Field of Classification Search .......... 438/50–53; 257/254, 415–419, E21.613, E29.324
See application file for complete search history.

(56) References Cited

U.S. PATENT DOCUMENTS

| 6,106,735 | A  * | 8/2000 | Kurle et al. .............. 216/2 |
| 6,265,246 | B1 * | 7/2001 | Ruby et al. ............. 438/113 |
| 6,388,299 | B1   | 5/2002 | Kang et al. |
| 6,514,789 | B2 * | 2/2003 | Denton et al. .............. 438/106 |
| 6,720,634 | B2   | 4/2004 | Kang |
| 7,034,375 | B2   | 4/2006 | Kang |
| 7,323,355 | B2 * | 1/2008 | Oi ............................... 438/51 |
| 2002/0031854 | A1 * | 3/2002 | Walker .......................... 438/49 |

OTHER PUBLICATIONS

Kang, J.W., "Surface micromachined multi-layer moving gate field effecttransistor (MOGFET) pressure switch with integrated vacuum sealed cavity", *Twelfth IEEE International Conference on Micro Electro Mechanical Systems*, (1999),499-504.

* cited by examiner

*Primary Examiner* — Quoc D Hoang
(74) *Attorney, Agent, or Firm* — Schwegman, Lundberg & Woessner, P.A.

(57) ABSTRACT

Apparatus, methods, and systems for bonding a cover wafer to a MEMS threshold sensors located on a silicon disc. The cover wafer is trenched to form a region when bonded to the silicon wafer that produces a gap over the contact bond pads of the MEMS threshold sensor. The method includes a series of cuts that remove part of the cover wafer over the trenches to permit additional cuts that may avoid the contact bond pads of the MEMS threshold sensor. In addition the glass frit provides for isolation of the sensor with a hermetic seal. The cavity between the MEMS threshold sensor and the cover wafer may be injected with a gas such as nitrogen to influence the properties of the MEMS threshold sensor. The MEMS threshold sensor may be utilized to sense a threshold for pressure, temperature or acceleration.

19 Claims, 6 Drawing Sheets

METHOD FOR MEMS THRESHOLD SENSOR PACKAGING

BACKGROUND

Micro-electro-mechanical systems (MEMS) are well known in the art. The technology is of the very small, and merges at the nano-scale into nano-electro-mechanical systems (NEMS) and Nanotechnology. MEMS are also referred to as micro machines, or Micro Systems Technology (MST). MEMS generally range in size from a micrometer to a millimeter.

MEMS technology is finding its way into sensors and is utilized in a number of ways each and every day by electronic and mechanical systems. These systems may determine location, speed, vibration, stress, acceleration, temperature as well as a number of other characteristics. Many applications in consumer electronics, automotive electronics, audio/video, camcorder, camera, cell phone, games/toys, watches, PDA, GPS handhelds, medical devices, power supply on off system, navigation system and other electronic devices may utilize multiple sensors to meet their design objectives.

In many cases, automated decision making is done when a certain threshold value of a physical parameter is higher or lower than a set point. MEMS based threshold sensors provide a low cost fabrication solution.

DETAILED DESCRIPTION

Figure 1:
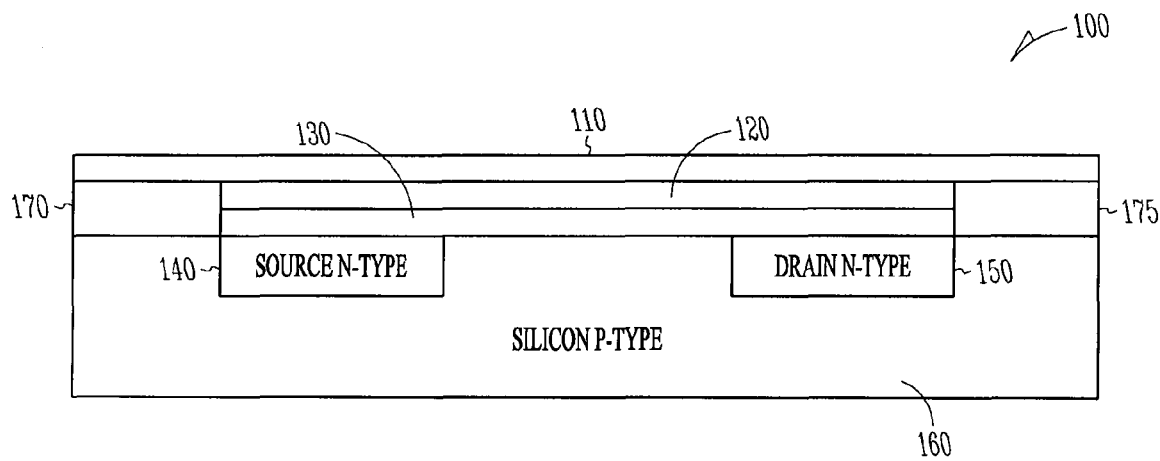
FIG. 1 is block diagram of a MEMS sensor operating as a suspended gate MOS transistor.

The inventors have determined that there is a need for a low cost, high performance, zero level, wafer level packaging technology for MEMS threshold sensors. FIG. 1 is a MEMS mechanically actuated field effect transistor (MAFET) switch performed in a semiconductor substrate. The threshold sensor 100 is based on a Metal Oxide Semiconductor Field Effect Transistor (MOSFET) with suspended, elastic gate 110, which is separated by an air/vacuum gap 120 from the thin gate dielectric 130. This type of threshold sensor is called a Mechanically Actuated Field Effect Transistor (MAFET) switch, where the suspended gate snaps "UP" or "DOWN" as a function of external measurand (temperature, pressure or acceleration) decreasing or increasing above a threshold value of that measurand, and thus driving the MOSFET transistor to the OFF state (no electric currents are flowing through the transistor) or ON state (an electric current is flowing through the transistor), respectively. The threshold sensor 100 comprises a MOSFET a source 140 and a drain 150 both of which may be n-type doped regions of the semiconductor substrate 160. The threshold sensor also has a gate 110, that can be made of highly doped polysilicon, metal or bimetal. To elevate the elastic gate 110, above the dielectric layer (130) two silicon dioxide posts 170 and 175 are provided.

Figure 2:
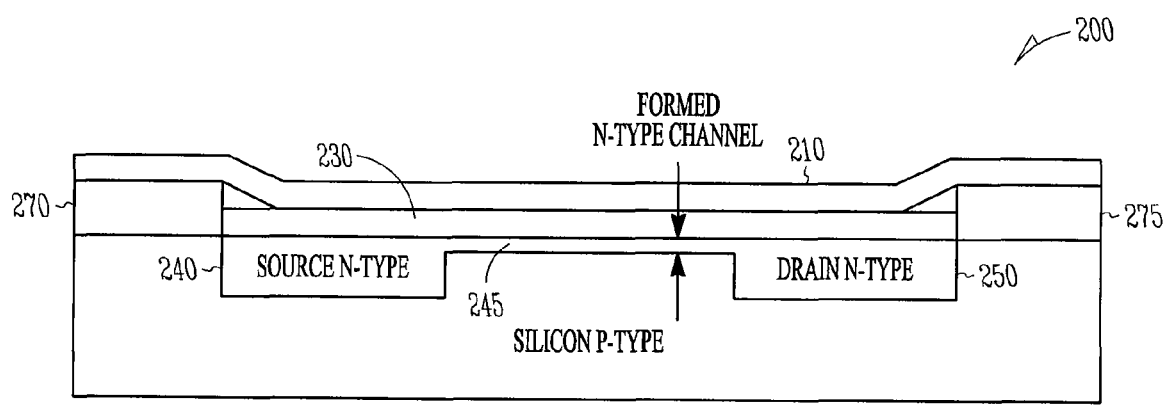
FIG. 2 illustrates the MAFET sensor, in the activated position.

FIG. 2 illustrates the MAFET threshold sensor 200, in the activated position. The beam 210 is snapped down due to pre-biased gate voltage $V_G$ and either the threshold temperature, pressure or shock. The silicon dioxide posts 270 and 275 hold the ends of the beam, however the air gap 120 of FIG. 1 is significantly reduced if not eliminated. An n-type channel 245 is formed between source 240 and drain 250 when the beam 210 is in contact with the dielectric layer 230.

While MAFETs have been used before, the inventors have created a method for low cost packaging of these MAFET threshold sensors. The packaging should meet the requirements of the MOSFET technology in terms of contamination, humidity free and low thermal budget of packaging technology that preserves the performances of the already fabricated chip.

Figure 3A:
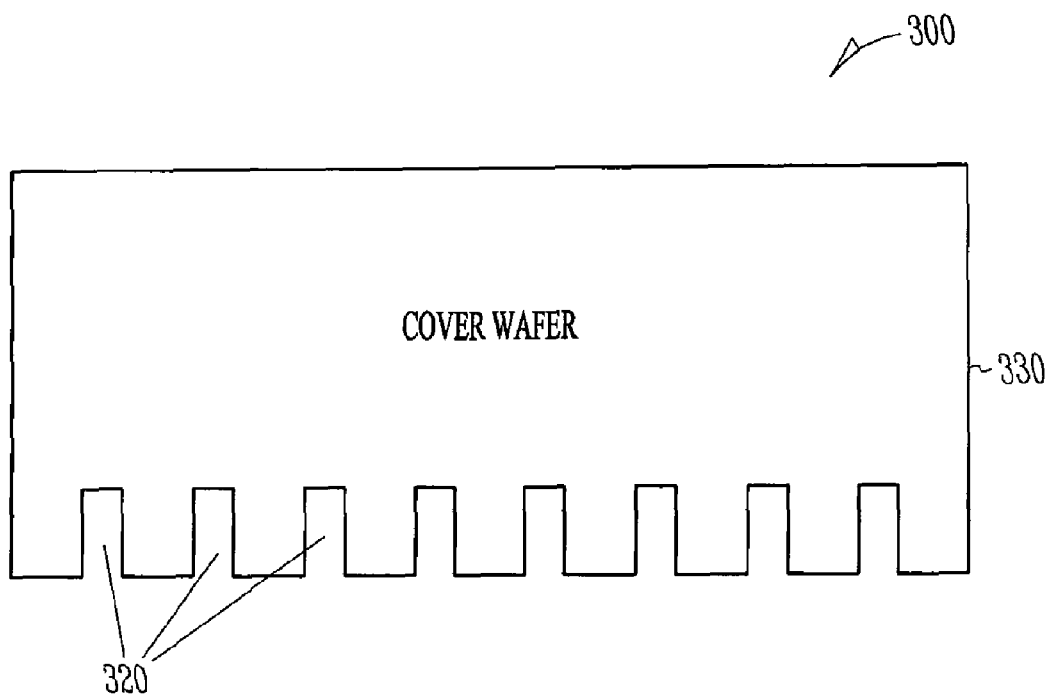
FIG. 3A is a block diagram of a cover wafer for a MAFET sensor according to an example embodiment.

FIG. 3A is a cover wafer for a MAFET threshold sensor 100 and 200 of FIGS. 1 and 2 respectively according to an example embodiment. Cover 300 incorporates a series of trenches 320. The trenches 320 may be formed in the cover material 330 by any number of processes including but not limited to etching, drilling or other means. The trenches are laid out to align with the outer edges of the sensors and may be located over the drain, source, gate and substrate bond pads of the sensor.

Figure 3B:
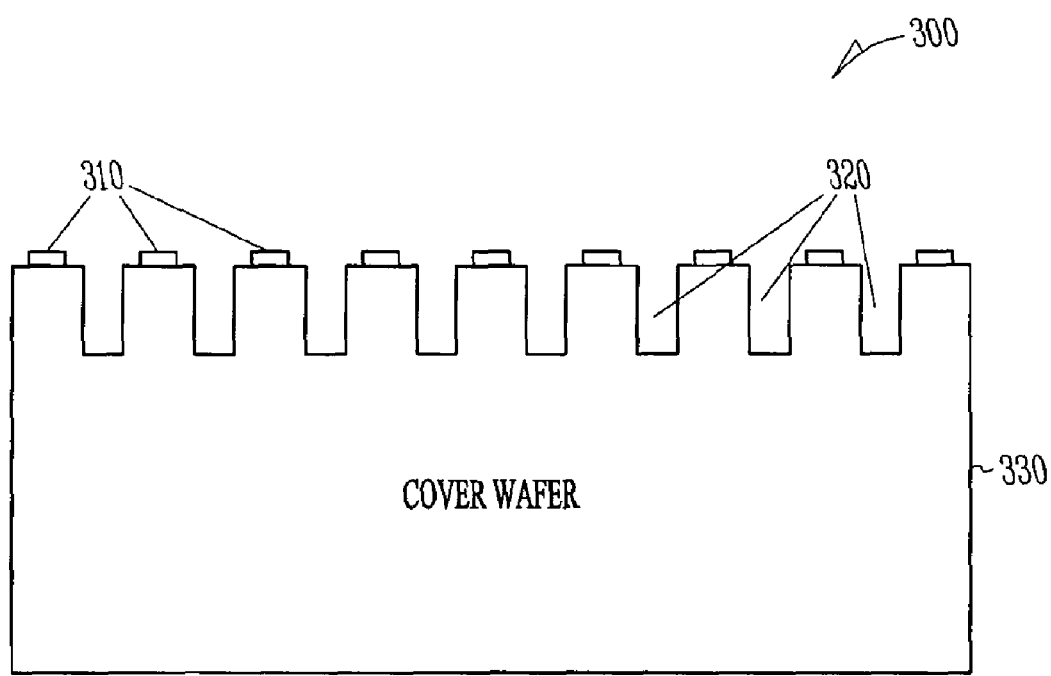
FIG. 3B is a cover wafer for a MAFET sensor with a glass frit applied according to an example embodiment.

FIG. 3B is a cover wafer for a MAFET threshold sensor with a glass frit 310 applied according to an example embodiment. Cover 300 has a glass frit 310 applied to the cover 330 in the selected areas between the trenches 320. The glass frit 310 may be applied either utilizing a screen print or by direct printing.

Figure 4A:
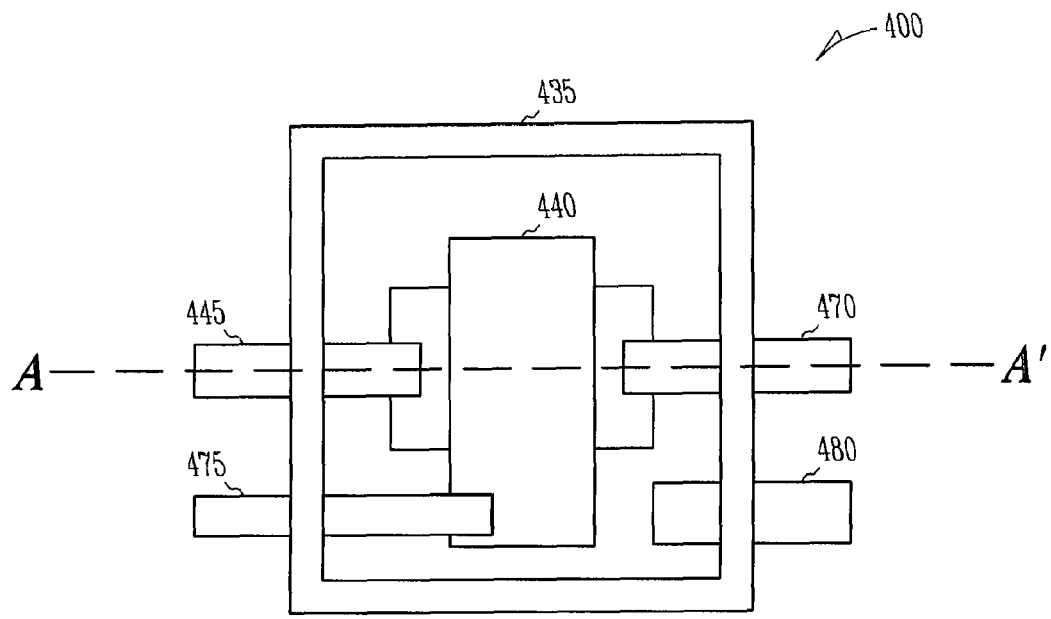
FIG. 4A illustrates a top view of the sensor with the cover mounted to it, as a part of entire wafer, according to an example embodiment.

FIG. 4A illustrates a top view of the threshold sensor with the cover mounted to it according to an example embodiment. The sensor 400 comprises a suspended gate 440 located within the glass frit 435. The glass frit 435 surrounds the suspended gate 440 at a distance such that it does not interfere with its movement. The source contact bond pad 445 extends beyond the glass frit, as does the drain contact bond pad 470, the gate contact bond pad 475, and the substrate pad 480. A cross sectional cut from A to A' is shown across the glass frit 435, the suspended gate 440 and the source and drain contact bond pads 445 and 470. The cross sectional view is shown in FIG. 4B.

Figure 4B:
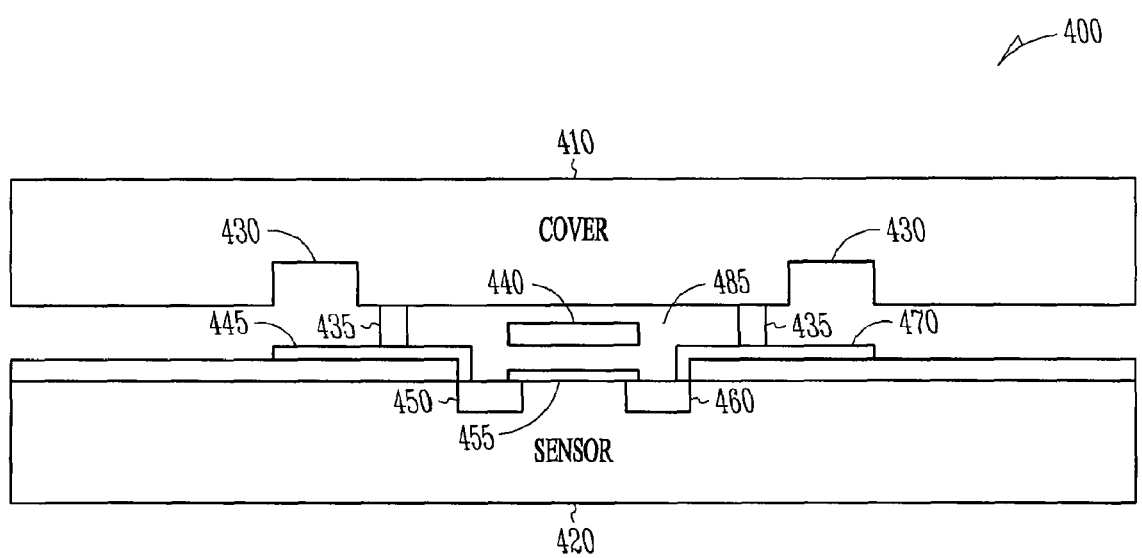
FIG. 4B illustrates a cross sectional view of the sensor with the cover mounted to it, as a part of the entire wafer, according to an example embodiment.

FIG. 4B illustrates a cross sectional view of the threshold sensor 400, as a part of the wafer with the cover mounted to it according to an example embodiment. The cover 410 is mounted onto the sensor 420 with glass frits 435. The glass frits 435 are positioned between the trench 430 and the suspended gate 440 such that the glass frit 435 provides a gap between the cover 410 and the threshold sensor 420. The glass frits 435 may be in contact with both the source contact bond pad 445 and the drain contact bond pad 470. The dielectric layer 455 is located from the source 450 to the drain 460 as illustrated in FIG. 1 and FIG. 2.

Figure 5:
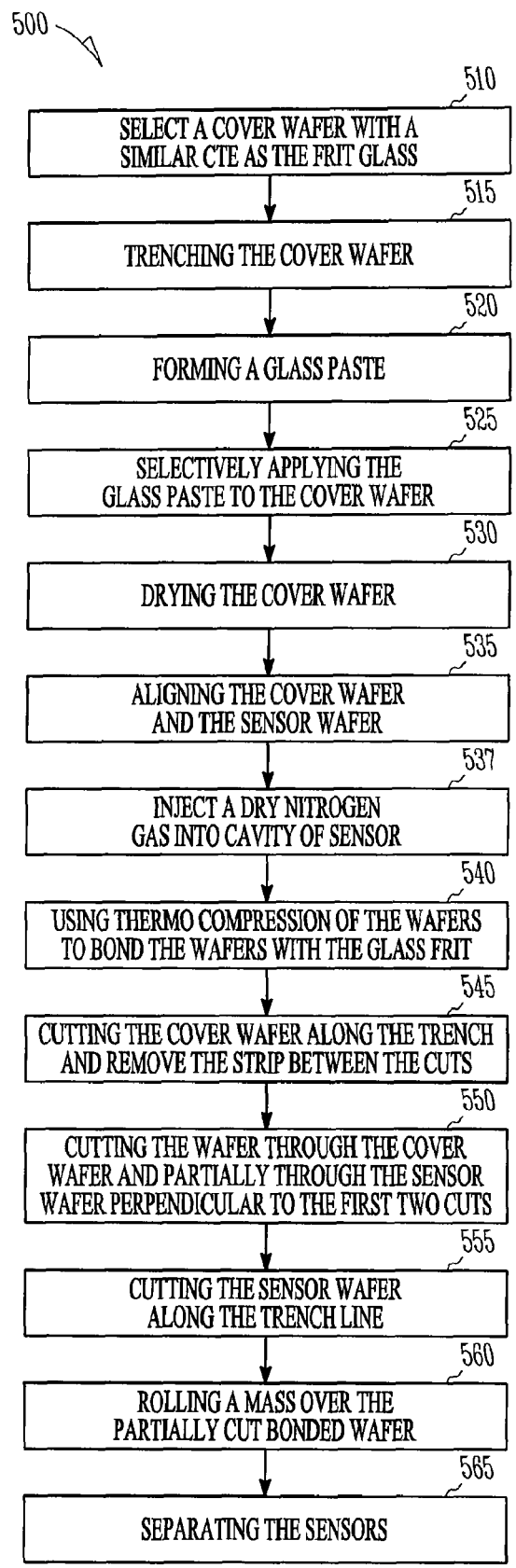
FIG. 5 illustrates a method for bonding a cover wafer to a sensor wafer and cutting the die into individual sensors according to an example embodiment.

The process 500 may be a method for bonding the cover wafer onto a temperature sensor MAFET (TMAFET) and acceleration threshold sensor g-MAFET. The process also cuts the die and may comprise the following activities. FIG. 5 is a method for bonding a cover wafer to a sensor wafer and cutting the die into individual sensors according to an example embodiment. At 510 a cover wafer is selected. The cover wafer may be either silicon wafer or glass wafer with the same diameter and similar thickness as sensor wafer. The silicon or the glass wafer should have the same coefficient of thermal expansion (CTE) as the flit glass to be used for wafer bonding. Both the frit glass and the cover wafer should be metal ion free, (concentration of $Na^+$, $Mg^+$, Mn, Cr, ions below 50 parts per billion (ppb)) to prevent contamination of the gate dielectric with ionic charges. The ionic charges which will generate an electric field altering in an unpredictable way the threshold voltage of the field effect metal oxide semiconductor (MOS) transistor. The inventors have determined for an example embodiment that the chemical formulation of the frit glass should not contain metal ions above 50 ppb. This is due to the situation that during thermal densification of glass some vapors containing those metal ions may go outside the frit glass and be adsorbed on the gate dielectric surface and from there be absorbed into the gate dielectric. Once absorbed, the ionic charges generate electric fields that may interfere with the electric field applied from outside. In addition, the ionic charges may have a thermal diffusion inside the dielectric as a function of the applied voltage, so the ionic charges move up and down depending on the absence or presence of the applied potential on the gate. This may result in the existence of random threshold voltage on the sensor. In further embodiments, the existence of such a random threshold voltage may not be a problem, or may not result from higher metal ion concentrations.

At 515 the cover wafer is trenched to a depth of approximately 50 micrometers with the diamond disc. The trenches are to be aligned above the metal bond pads of the sensor wafer such as bond pads 445, 470, 475, and 480 of FIG. 4.

At 520 a low temperature glass powder is prepared of a MOS compatible composition (concentration of metal ions like Na, Mg, Mn, Cr, etc., below 50 ppb in one embodiment). The glass powder is formed into a paste, containing base glass, refractory filler for decreasing the CTE of base glass and organic solvent for binding the components of the glass powder with the cover wafer.

At 525 the paste is selectively applied to the cover wafer by either traditional screen printing or direct printing by additive, mask-less paste application. The direct printing is computer controlled dispensing and no mask is needed.

At 530 the cover wafer and glass frit are dried for solvent evaporation and pre-consolidation of the glass paste or glass flit.

Figure 6:
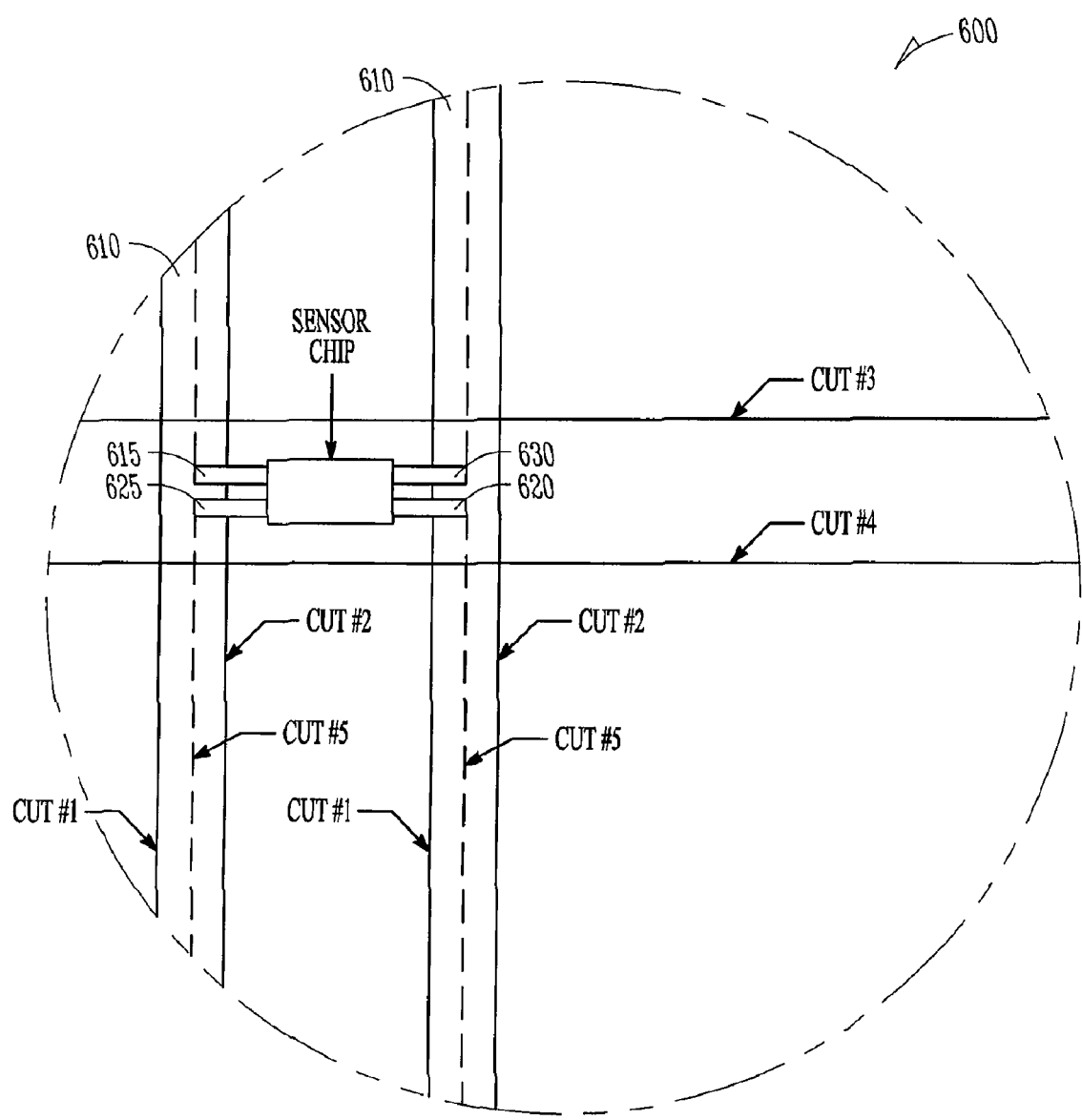
FIG. 6 illustrates a top view of the sensor with the cover, as a part of the entire wafer and the cut patterns for the die separation according to an example embodiment.

At 535 the cover wafer is aligned with the sensor wafer so that trenches in the cover wafer overlap over the metal bond pads of the threshold sensor. In FIG. 6 a top view the wafers is shown with the alignment of the trench after frit glass bonding. The trench 610 will align such that the end of the source contact bond pad 615 and the drain contact bond pad 620 will be located under the trench 610.

At 537 for a better thermal response by a temperature sensor (TMAFET) a dry nitrogen ($N_2$) or other inert gas at a pressure of 1 bar may be injected into the cavity 485 of FIG. 4B. The gas should be dry and as pure as possible to avoid contamination. The gas pressure influences the bending/vibration of pressure/acceleration diaphragm. By setting the pressure in cavity 485 it may be possible to modify the dynamic response properties of the threshold sensor 400 both of FIG. 4B. For example, the damping behavior of suspended gate 440 of FIG. 4 may be influenced. For a thermal threshold sensor TMAFET, the suspended gate 440 is fully immersed in $N_2$. For an acceleration threshold sensor or g-MAFET, the $N_2$ pressure may be characterized as "pushing" on the external side of suspended gate 440 which may affect the damping of suspended gate 440.

At 540 the cover wafer and sensor wafer with the flit glass are subject to thermal compression in an oven at temperature below 400 C preserving the sensor metallization from deterioration. The temperature used for the frit glass consolidation should be low enough so that the temperature does not affect the metallurgy of the metal-semiconductor contacts 615, 620, 625, or 630 of FIG. 6. In the case of gold metallization for bond pads, chromium/nickel, titanium nitride (/TiN), or chromium/nickel/tantalum nitride (Cr/Ni/TaN) barrier layers or others should be used below the gold layer to stop the gold from diffusing toward the silicon wafer. The final height of the flit glass spacer may be in the range of 10-40 micrometers, high enough to allow the snapping up and down of the suspended diaphragm of MAFET.

At 545 the bonded cover wafer is cut along the trenches using a diamond saw. As shown in FIG. 6, CUT #1 and CUT #2 are along the trench lines, so that a stripe corresponding to the trenches 610 above the bond pads 615, 620, 625 and 630 may be removed. CUT #1 and CUT#2 only cut through the cover wafer and do not cut or touch the bond pads 615 or 620, 625 and 630.

At 550 CUT #3 and CUT #4 are completed as seen in FIG. 6. Cut lines three and four will fully perforate the cover wafer and partially cut the sensor wafer. The sensor wafer may be cut approximately half way through.

At 555 with the strip above trenches 610 are removed and CUT #5 may be to cut the sensor wafer through the chip between two wafers, without touching the bonding pads. The cutting sequence is repeated across the wafer with a well defined repetition step. However, at the end of cutting sequence, the bonded wafer is still in one piece.

At 560 a heavy cylinder mass is rolled over the partially cut bonded wafer tandem. At 565 the sensors are separated.

The frit glass wafer level packaging of an acceleration MAFET sensor (g-MAFET) should be done exactly in the same way, with the advantage that the vacuum level above the suspended diaphragm of the acceleration threshold sensor can be flexible designed.

Figure 7:
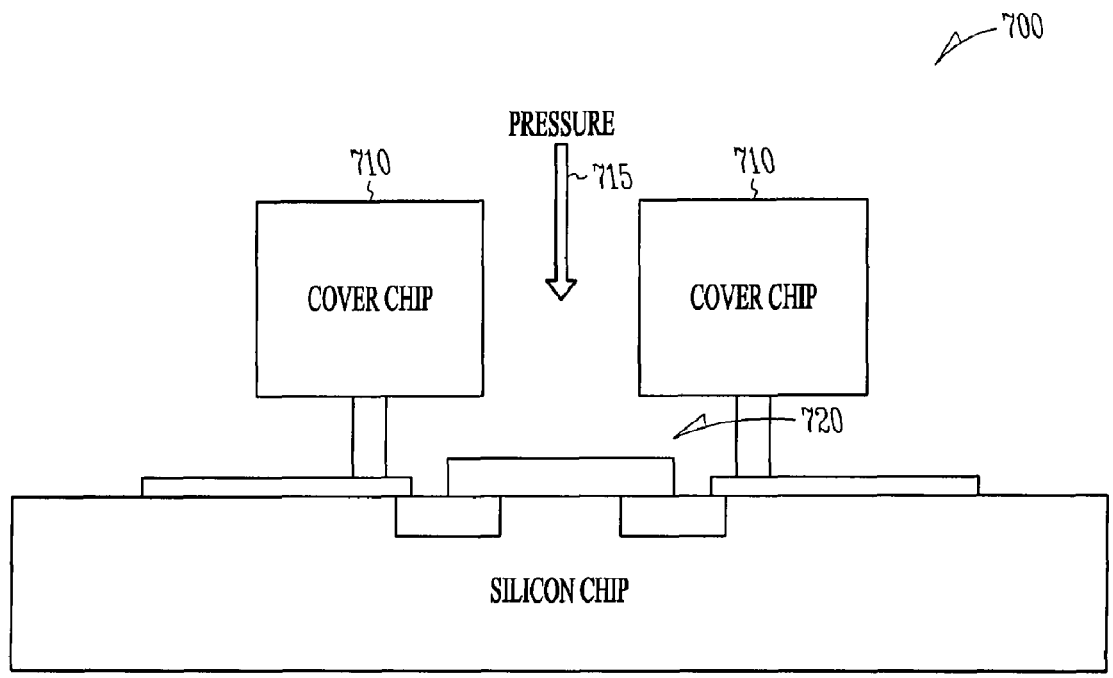
FIG. 7 illustrates a block cross sectional view of a pressure sensor according to an example embodiment.

FIG. 7 illustrates a cross sectional view of a pressure threshold sensor according to an example embodiment. The frit glass packaging of the pressure MAFET (P-MAFET) is different with respect to above bonding technology for temperature and acceleration sensors, by the fact that after activity 540 a selective perforation of the cover wafer 710 is done so that each chip will have a hole 715 above the cavity 720 of FIG. 7.

Figure 8:
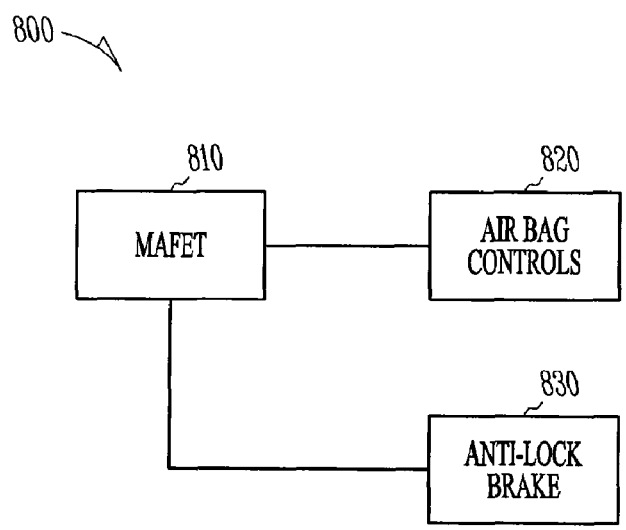
FIG. 8 illustrates a system incorporating an embodiment of the invention.

FIG. 8 illustrates a system incorporating an embodiment of the invention. System 800 may be utilized in a moving vehicle such as an automobile. MAFET 810 may provide information to one or more of the following: an airbag control 820, or an anti-lock brake control 830. The MAFET 810 may indicate that a threshold such an acceleration or deceleration has been exceeded. For example, if the car should come to a sudden stop an acceleration threshold sensor may indicate that threshold has been exceeded to the airbag control 820 indicating when the airbag should deploy. In addition, the MAFET 810 may provide information that a temperature is below a threshold permitting ice to form. This information may be provided to anti-lock brake system 830.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. The above description and figures illustrate embodiments of the invention to enable those skilled in the art to practice the embodiments of the invention. Thus the following claims are hereby incorporated into the Detailed Description, with each claim standing on its own as a separate embodiment.

What is claimed is:

1. A method comprising:
    forming a trench in a cover wafer;
    applying a glass frit to the cover wafer;
    bonding the glass frit to a sensor wafer outside a perimeter of a silicon MOSFET threshold sensor having a moveable gate, wherein the silicon MOSFET threshold sensor is formed on the sensor wafer such that the trench is outside the perimeter and the glass frit provides a gap between the cover wafer and the moveable gate to permit movement of the moveable gate;
    removing a strip from the cover wafer along the trench without cutting the sensor wafer; and
    cutting through the cover wafer and a portion of the sensor wafer in a direction that is orthogonal to the trench.

2. The method of claim 1, wherein the cover wafer is one of a silicon or a glass.

3. The method of claim 2 wherein the cover wafer has a thermal coefficient of expansion similar to the glass frit.

4. The method of claim 1, wherein the cover wafer is trenched such that metal bond pads are spatially isolated from the cover on at least one cut line.

5. The method of claim 4 comprising removing a strip of the cover wafer corresponding to the trenched portion of the cover.

6. The method of claim 1, wherein the glass frit forms a hermetic die isolation of the silicon MOSFET threshold sensor.

7. The method of claim 6, wherein the glass frit is deposited by means of screen printing and surrounds the moveable gate.

8. The method of claim 6, wherein the glass frit is deposited by means of direct printing by additive, mask-less paste application.

9. The method of claim 6, further comprises, drying of the cover.

10. The method of claim 9, wherein the cover is trenched such that the metal bond pads are spatially isolated from the cover on at least one cut line.

11. The method of claim 1 wherein the glass frit is a composition compatible with CMOS.

12. The method of claim 1 wherein the metal content of the glass frit is approximately at or below 50 parts per billion.

13. The method of claim 1, wherein a height of the glass frit after thermal compression is in the range of 10-50 micrometers.

14. The method of claim 1, further comprising creating a hole in the cover of the above the silicon MOSFET threshold sensor.

15. The method of claim 1, wherein a cavity formed by the cover wafer above the silicon MOSFET threshold sensor contains an inert gas.

16. The method of claim 1, wherein the glass frit contains approximately less than 50 ppb of metal ions.

17. The method of claim 1, further comprising extending a tool through the strip in the cover wafer to cut the sensor wafer.

18. A method comprising:
    forming a trench in a cover wafer;
    applying a glass frit to the cover wafer;
    bonding the glass frit to a sensor wafer outside a perimeter of a silicon MOSFET threshold sensor having a moveable, wherein the silicon MOSFET threshold sensor is formed on the sensor wafer such that the glass frit surrounds the gate and provides the only separation between the cover wafer and the sensor to allow the gate to move without interference;
    removing a strip from the cover wafer along the trench without cutting the sensor wafer; and
    cutting through the cover wafer and a portion of the sensor wafer in a direction that is orthogonal to the trench.

19. The method of claim 18, further comprising extending a tool through the strip in the cover wafer to cut the sensor wafer.

* * * * *